United States Patent
Shinzato

(10) Patent No.: US 10,978,966 B2
(45) Date of Patent: Apr. 13, 2021

(54) VIBRATION WAVE ACTUATOR, IMAGING APPARATUS, AND STAGE APPARATUS USING THE SAME

(71) Applicant: CANON KABUSHIKI KAISHA, Tokyo (JP)

(72) Inventor: Yuki Shinzato, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 136 days.

(21) Appl. No.: 16/141,192

(22) Filed: Sep. 25, 2018

(65) Prior Publication Data
US 2019/0103822 A1 Apr. 4, 2019

(30) Foreign Application Priority Data
Sep. 29, 2017 (JP) .............................. JP2017-192058

(51) Int. Cl.
*G02B 7/02* (2021.01)
*H02N 2/06* (2006.01)
(Continued)

(52) U.S. Cl.
CPC ............ *H02N 2/062* (2013.01); *G01R 33/072* (2013.01); *G02B 7/10* (2013.01); *G02B 21/26* (2013.01); *H01L 41/0906* (2013.01); *H02N 2/0015* (2013.01); *H02N 2/0055* (2013.01); *H02N 2/026* (2013.01); *G03B 2205/0061* (2013.01); *H02N 2/028* (2013.01)

(58) Field of Classification Search
CPC ... G02B 7/04; G02B 7/08; G02B 7/09; G02B 7/10; G02B 7/36; G02B 7/102; G02B 21/26; H02N 2/001; H02N 2/004; H02N 2/0085; H02N 2/026; H02N 2/103

USPC ............ 310/311, 317, 323.02, 328; 359/393, 359/811, 813, 824
See application file for complete search history.

(56) References Cited

U.S. PATENT DOCUMENTS

| | | | |
|---|---|---|---|
| 2011/0199696 A1 | 8/2011 | Lee et al. | |
| 2011/0234042 A1* | 9/2011 | Oda | ........................ H01L 41/35 310/300 |
| 2018/0254717 A1* | 9/2018 | Zhelyaskov | ......... H02N 2/0085 |

FOREIGN PATENT DOCUMENTS

| | | |
|---|---|---|
| CN | 102749697 A | 10/2012 |
| CN | 104009725 A | 8/2014 |

(Continued)

*Primary Examiner* — Mahidere S Sahle
(74) *Attorney, Agent, or Firm* — Canon U.S.A., Inc. IP Division

(57) ABSTRACT

A vibration wave actuator has a vibration member including an elastic member and an electro-mechanical energy transducer, and a contact member in contact with the vibration member, and the contact member and the vibration member move relative to each other. The vibration wave actuator includes a detected portion configured to move, together with the contact member, relative to the vibration member, and a detection unit configured to move, together with the vibration member, relative to the contact member to detect displacement information or position information for the detected portion. The vibration member has two projections provided side by side in a direction intersecting with the direction of the relative movement. The contact member contacts the two projections. The detection unit and the detected portion are located between the contact member and the vibration member when viewed from the direction of the relative movement.

20 Claims, 14 Drawing Sheets

(51) Int. Cl.
*H02N 2/00* (2006.01)
*H02N 2/02* (2006.01)
*G01R 33/07* (2006.01)
*G02B 7/10* (2021.01)
*G02B 21/26* (2006.01)
*H01L 41/09* (2006.01)

(56) References Cited

FOREIGN PATENT DOCUMENTS

| | | |
|---|---|---|
| CN | 105319663 A | 2/2016 |
| JP | 2001-069772 A | 3/2001 |
| JP | 2007312519 A | 11/2007 |
| JP | 2009027865 A | 2/2009 |

* cited by examiner

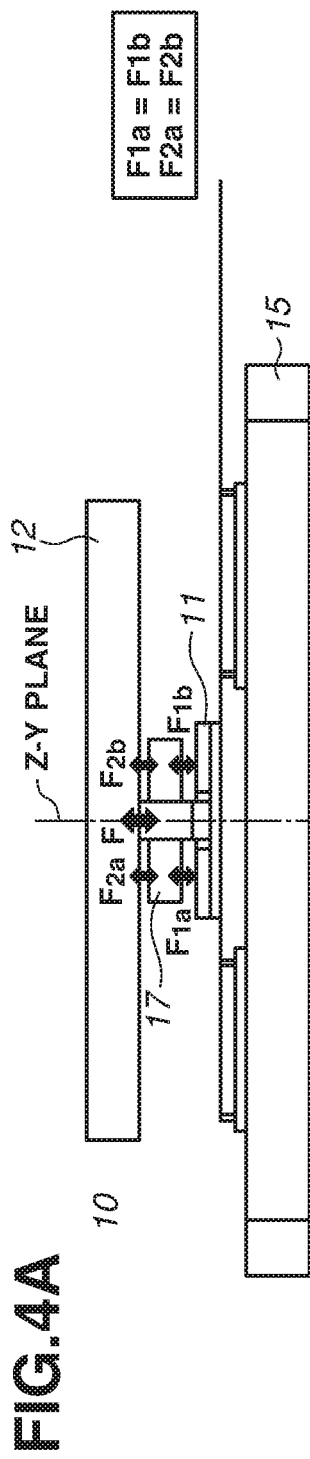
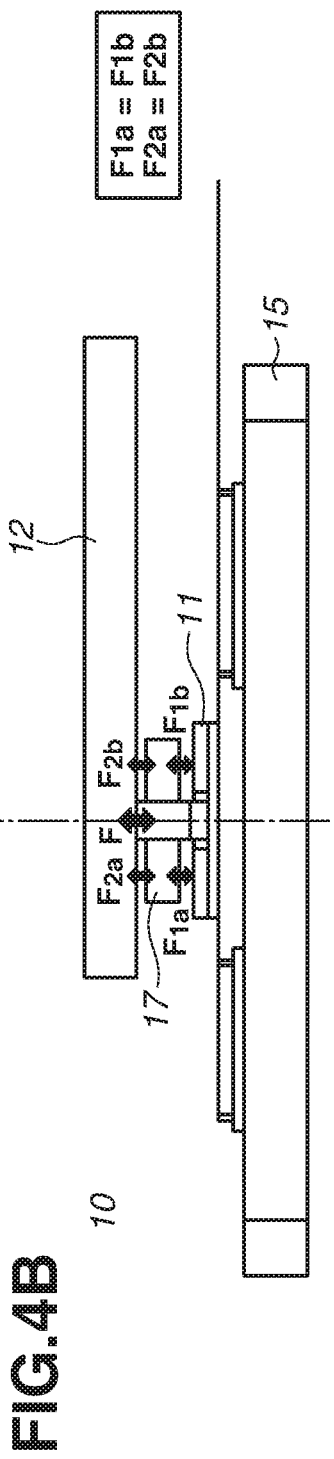
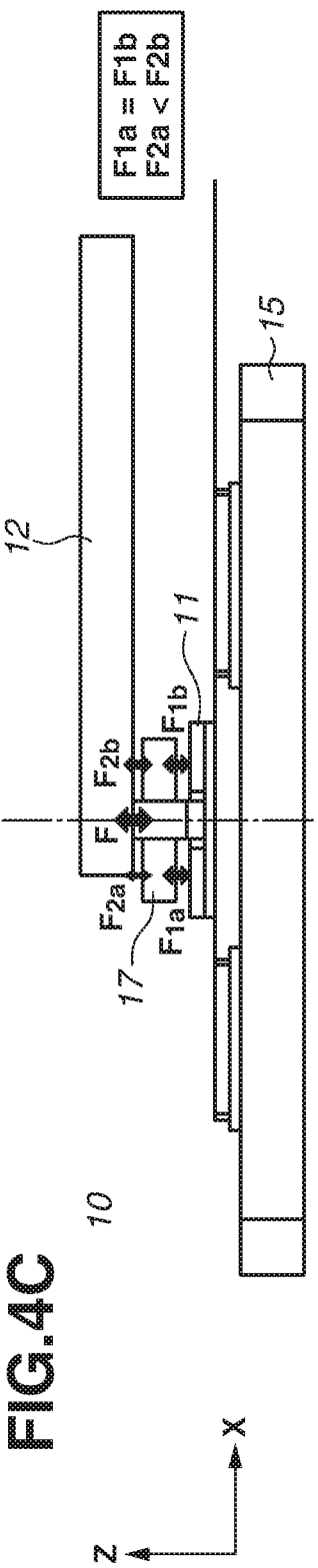

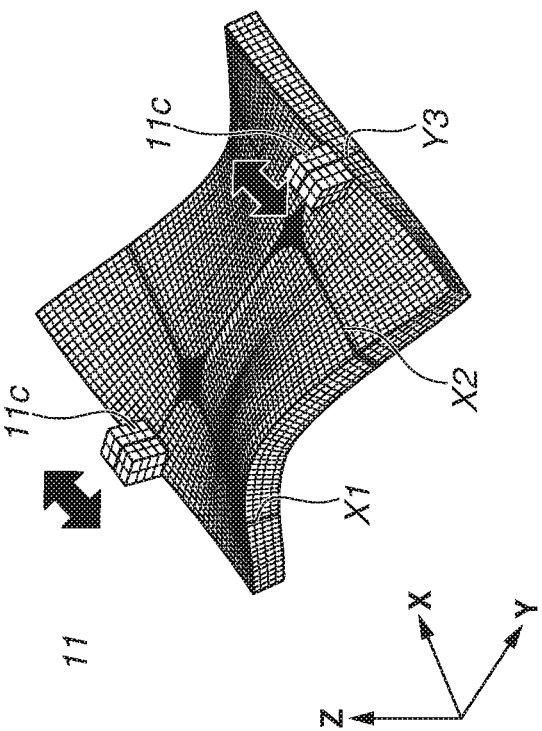
FIG.5A FIRST BENDING VIBRATION MODE
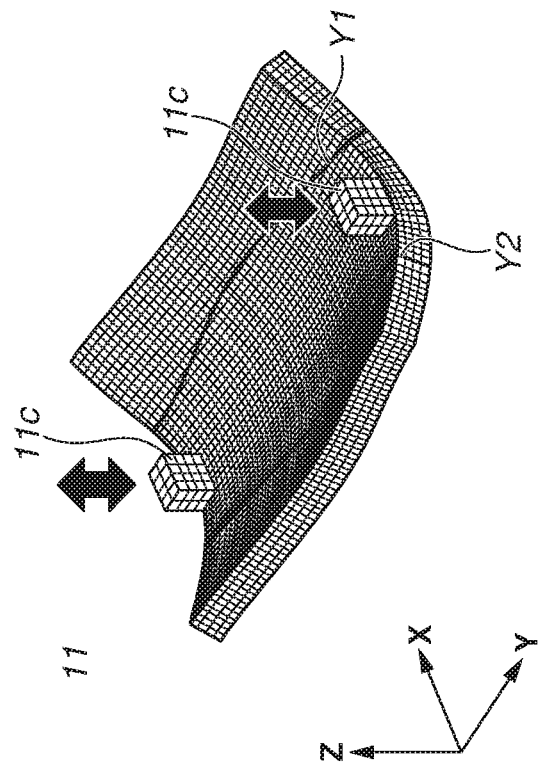
FIG.5B SECOND BENDING VIBRATION MODE

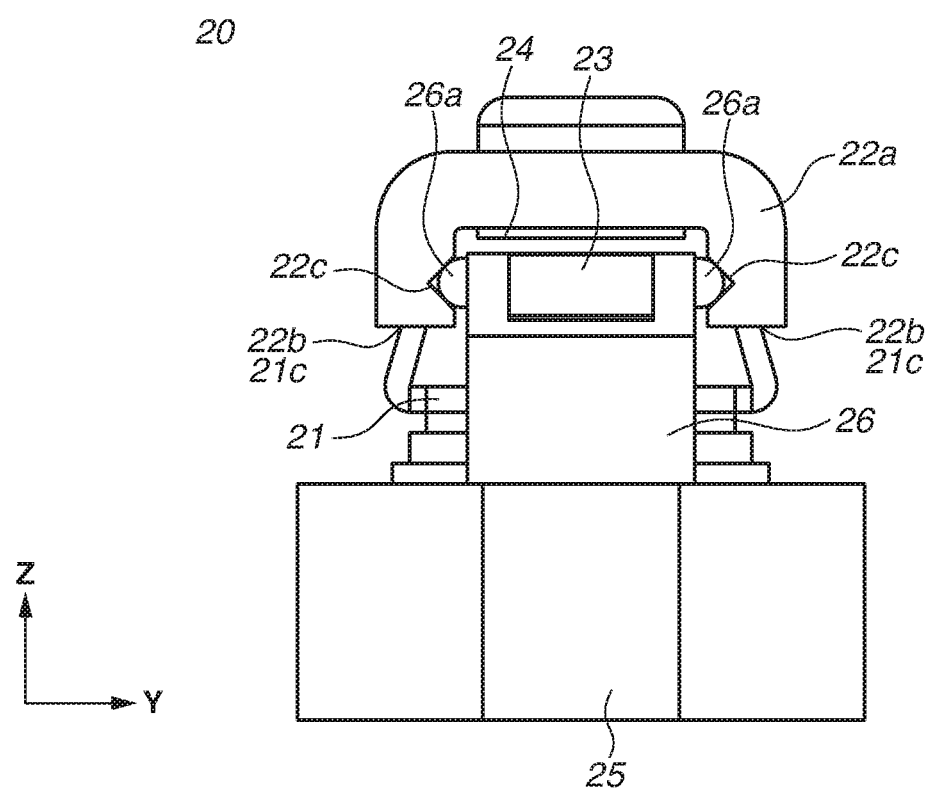

VIBRATION WAVE ACTUATOR, IMAGING APPARATUS, AND STAGE APPARATUS USING THE SAME

BACKGROUND OF THE INVENTION

Field of the Invention

The present invention relates to a vibration wave actuator, an imaging apparatus, and a stage apparatus using the vibration wave actuator.

Description of the Related Art

A vibration wave actuator is an actuator for extracting a driving force through a frictional force by using a small vibration of a vibration member as a driving source. Even if the vibration wave actuator is reduced in size and shape, it can achieve high thrust performance through a frictional force, high-speed response with low inertia, and high-accuracy positioning through a small vibration, compared with an electromagnetic motor. To achieve high-accuracy positioning, a detection unit may also be provided in the vibration wave actuator.

For example, Japanese Patent Application Laid-Open No. 2009-27865 discusses a driving apparatus 910 for exciting a vibration combining two different vibration modes in a vibration member 911 to move a driven member (contact member) 912 relative to the vibration member 911 in pressure contact with the vibration member 911, as illustrated in FIG. 13. Japanese Patent Application Laid-Open No. 2009-27865 discusses a configuration in which the contact member 912 is provided with a scale (detected portion) 914 with a pattern used for displacement information detection drawn thereon, and an encoder main body (detection unit) 913 is disposed on a holding member to face the scale 914. This makes it possible to detect a relative positional relation between the housing 915 and the contact member 912 as electronic information. Therefore, high-accuracy position control of the vibration wave actuator can be achieved by feeding back this electronic information to a control system in a resolution range of the displacement information of the vibration wave actuator (having the vibration member 911 and the contact member 912) and the encoder main body 913.

As illustrated in FIG. 14, Japanese Patent Application Laid-Open No. 2001-69772 discusses a vibration wave actuator 920 in which a pattern (detected portion) 924 is disposed along the moving direction of a contact member 922 on the plane of a vibration member 921, and an optical encoder main body (detection unit) 923 is disposed on the contact member 922 face the pattern 924. Since a detection unit is built in the vibration wave actuator 920, it becomes unnecessary to provide a space for disposing the encoder main body 923 in a housing 925, allowing the vibration wave actuator 920 to be reduced in size.

However, in the driving apparatus (vibration wave actuator) 910 discussed in Japanese Patent Application Laid-Open No. 2009-27865, an encoder (the detection unit 913 and the detected portion 914) as a detection unit for detecting the relative positional relation between the contact member 912 and the fixed stand 915 is disposed outside a driving unit including the vibration member 911 and the contact member 912. Therefore, even if the driving unit is reduced in size, an area for disposing the encoder is required, possibly making it impossible to sufficiently reduce the size of the vibration wave actuator.

In the vibration wave actuator 920 discussed in Japanese Patent Application Laid-Open No. 2001-69772, since the scale (detected portion) 924 is provided on the side of the vibration member 921, the vibration state of the scale 924 needs to be taken into consideration in vibration design to form a desired vibration state, causing difficulty in design. In addition, providing the encoder main body (detection unit) 923 on the side of the contact member 922 makes it necessary to extend an electrically conductive member therefrom. This may possibly cause a load such as a bending of the electrically conductive member when a motor is driven.

In view of the above-described problem, the present invention is directed to a vibration wave actuator which can be further reduced in size than a conventional case while reducing adverse effects on the driving performance due to the provision of an encoder unit (encoder) for detecting displacement information or position information. The "displacement information" refers to information detected by what is called an incremental encoder. The "position information" refers to information detected by what is called an absolute encoder.

SUMMARY OF THE INVENTION

According to an aspect of the present invention, a vibration wave actuator having a vibration member including an elastic member and an electro-mechanical energy transducer, and a contact member in contact with the vibration member, the contact member and the vibration member moving relative to each other, includes a detected portion configured to move, together with the contact member, relative to the vibration member, and a detection unit configured to move, together with the vibration member, relative to the contact member to detect displacement information or position information for the detected portion, wherein the vibration member has two projections provided side by side in a direction intersecting with the direction of a relative movement, wherein the contact member contacts the two projections, and wherein the detection unit and the detected portion are located between the contact member and the vibration member when viewed from the direction of the relative movement.

Further features of the present invention will become apparent from the following description of exemplary embodiments with reference to the attached drawings.

BRIEF DESCRIPTION OF THE DRAWINGS

FIGS. 4A, 4B, and 4C illustrate a relationship between a length of the permanent magnets and the moment generated around a driven member (contact member) according to the first exemplary embodiment.

FIGS. 5A and 5B are perspective views illustrating two different bending vibration modes for exciting a vibration member illustrated in FIGS. 1A and 1B.

FIG. 9 is a plan view illustrating a contact member according to the second exemplary embodiment when viewed from the moving direction.

DESCRIPTION OF THE EMBODIMENTS

Exemplary embodiments of the present invention will be described in detail below with reference to the accompanying drawings.

Figure 1A:
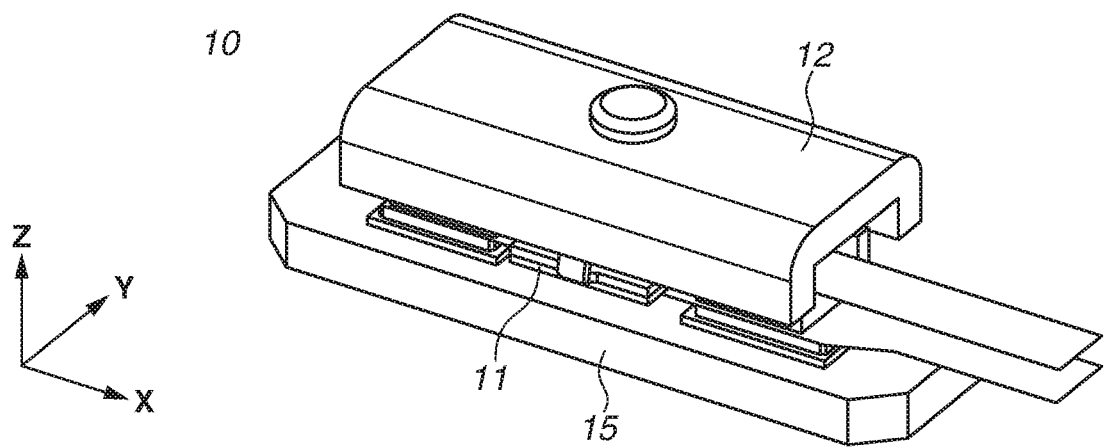
FIGS. 1A and 1B are perspective views schematically illustrating a configuration of a vibration wave actuator according to a first exemplary embodiment.
Figure 1B:
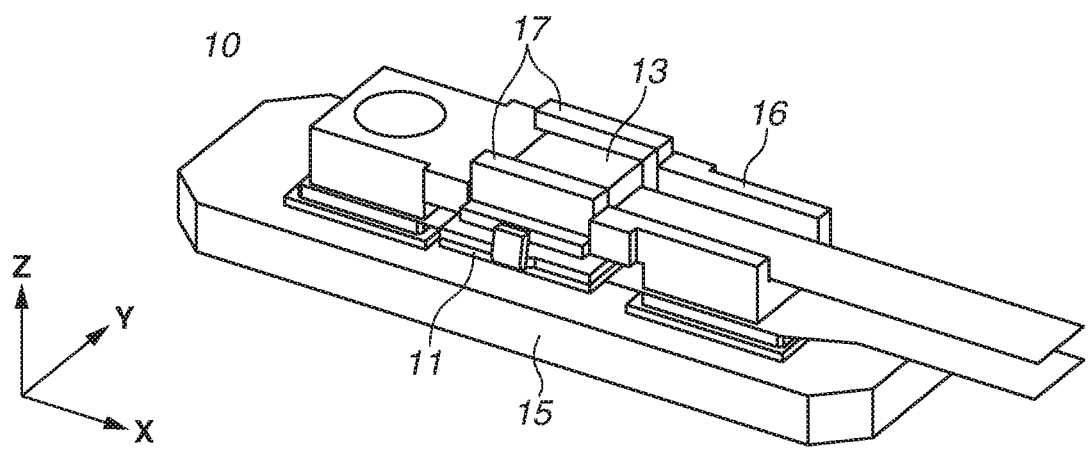
Figure 2:
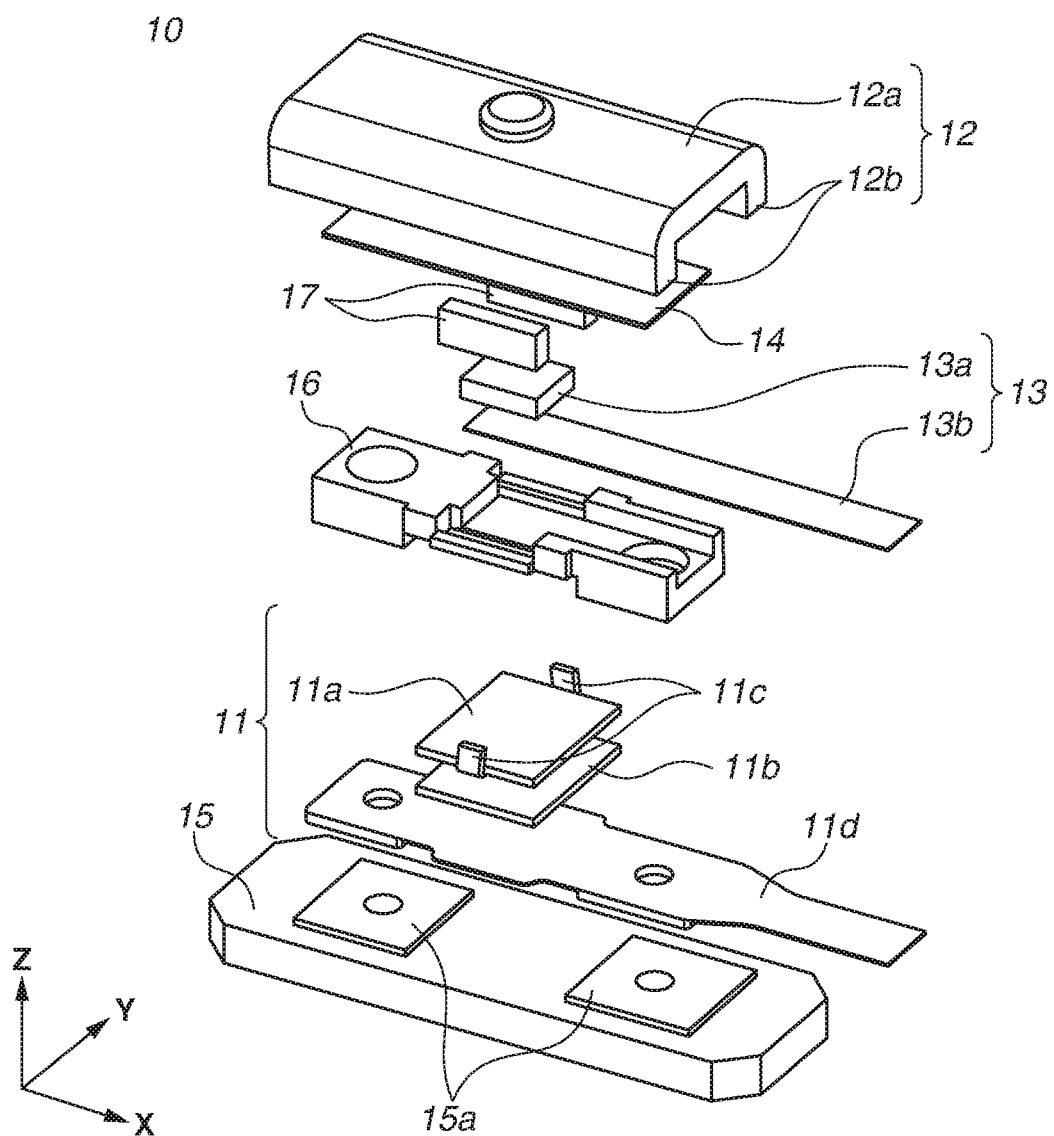
FIG. 2 is an exploded perspective view illustrating components of the vibration wave actuator according to the first exemplary embodiment.

A configuration of a vibration wave actuator 10 according to a first exemplary embodiment will be described below with reference to FIGS. 1A, 1B, and 2. FIG. 1A is a perspective view illustrating an overall configuration of the vibration wave actuator 10, and FIG. 1B is a perspective view illustrating the vibration wave actuator 10 with a driven member (contact member) 12 and a scale (detected portion) 14 not illustrated. FIG. 2 is an exploded perspective view illustrating components of the vibration wave actuator 10. In subsequent descriptions, as illustrated in FIGS. 1A, 1B, and 2, the moving direction of the vibration member 11 relative to the contact member 12 (i.e., moving direction of the contact member 12) indicates the X direction, and the direction in which the vibration member 11 and the contact member 12 are brought into pressure contact with each other (i.e., the direction in which the vibration member 11 and the contact member 12 contact) indicates the Z direction in a three-dimensional orthogonal coordinate system (X, Y, and Z directions). The Y direction is orthogonal to the X and the Z directions. In this case, the X direction is the lateral direction of the vibration member 11, and the Y direction is the longitudinal direction of the vibration member 11. The moving direction of the vibration member 11 relative to the contact member 12 (i.e., moving direction of the contact member 12) is the direction in which the vibration member 11 and the contact member 12 move relative to each other through an elliptical vibration generated at projections 11c of the vibration member 11 by exciting vibrations in the vibration member 11.

The vibration wave actuator 10 includes the vibration member 11, the contact member 12, an encoder main body (detection unit) 13, the scale (detected portion) 14, a housing 15, a holding member 16, and pressure members 17.

The vibration member 11 includes an elastic member 11a, an electro-mechanical energy transducer 1ib bonded to the elastic member 11a, and a flexible printed circuit board 11d.

The elastic member 11a is formed in a rectangular plate shape and is provided with the two different projections 11c protruding toward the opposite side of the bonding surface of the electro-mechanical energy transducer 11b. The elastic member 11a is desirably made of a metal material such as SUS420J2, martensite stainless steel.

The electro-mechanical energy transducer 11b is a piezoelectric element. The flexible printed circuit board 11d is bonded to the surface on the opposite side of the bonding surface of the electro-mechanical energy transducer 11b to the elastic member 11a.

According to the present exemplary embodiment, the flexible printed circuit board 11d is provided with two layers of a base member and an electrically conductive member sandwiched between the two layers of the base member. The flexible printed circuit board 11d is partly provided with backing members which are fixed to fixing portions 15a of the housing 15 illustrated in FIG. 2 to support the vibration member 11. In this way, the flexible printed circuit board 11d as a power supply member has not only a function of supplying power but also a function of supporting the vibration member 11. In addition, the sheet portion of the flexible printed circuit board 1id extending from the vibration member 11 has a sufficiently small thickness and low rigidity for the fixing portions 15a of the backing members. Therefore, the supporting portion of the flexible printed circuit board 11d also substantially has a function of insulating vibration. Therefore, no additional support member for supporting the vibration member 11 is required, making it possible to reduce the number of parts and the number of assembly processes. Although, on the flexible printed circuit board 1id, the hacking members are fixed to the fixing portions 15a with adhesive, the fixing method is not limited thereto. The backing members may be fixed through sandwiching with pressing plates, fastening with bolts, or caulking.

The tips of the two projections 11c provided on the elastic member 11a are in pressure contact with the contact member 12 (contact portions 12b thereof). The projections 11c are located in the direction intersecting with the moving direction of the vibration member 11 relative to the contact member 12 (and the pressurizing direction). According to the present exemplary embodiment, the projections 11c are located along with the approximately lateral direction of the vibration member 11 (approximately in the Y direction). The tips of the projections 11c can be provided with contact surfaces having a desired coefficient of friction and excellent wear resistance. The projections 11c are integrally formed with the elastic member 11a by partially bending the elastic member 11a through bending processing. For the surfaces of the projections 11c on the side of the contact member 12, desired contact surfaces are formed through heat processing or surface polishing. The projections 11c are not necessarily configured as described above and may be formed through etching processing or formed separately from the elastic member 11a and then fixed to the elastic member 11a. Alternatively, contact surfaces of the projections 11c facing the contact member 12 may be provided through other methods, for example, plating treatment. In the configuration according to the present exemplary embodiment in which the projections 11c, the contact surfaces thereof, and the elastic member 11a are integrally formed, the assembly man-hours can be reduced in comparison with a case where these components are separately formed and bonded. In addition, this configuration is desirable since it can prevent variations in parts because positioning of the projections 11c is not required.

Figure 7:
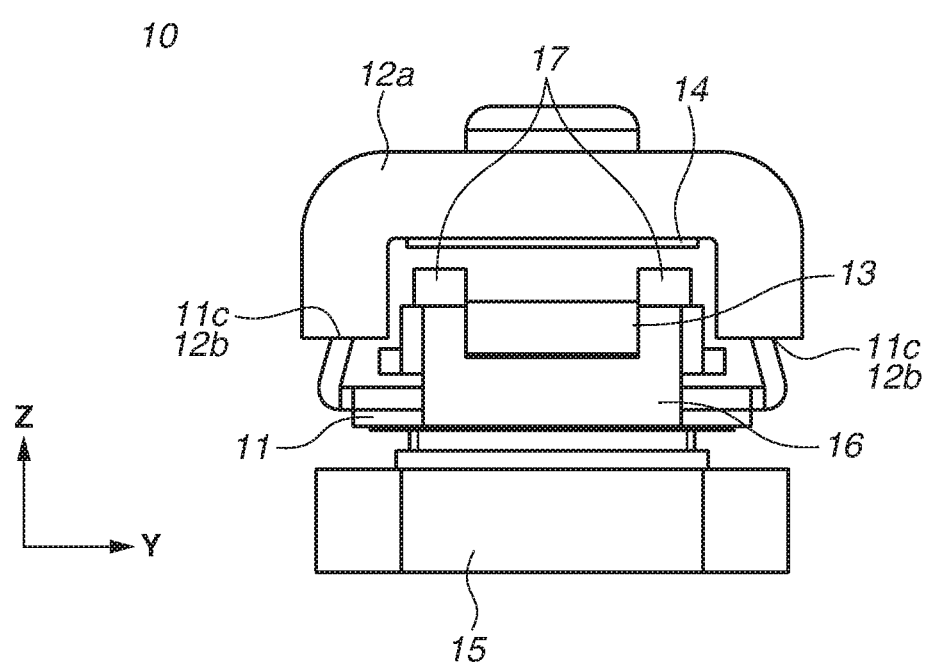
FIG. 7 is a plan view illustrating an example arrangement of a positioning detection unit according to the first exemplary embodiment when viewed from the moving direction of the contact member.

The contact member 12 has a yoke 12a on which the two contact portions 12b coming into contact with the projections 11c of the vibration member 11 are formed. The yoke 12a is a ferromagnetic material. According to the present exemplary embodiment, like the elastic member 11a, the yoke 12a is made of a metal material such as SUS420J2, which is martensitic stainless steel. As illustrated in FIG. 7, the yoke 12a is provided with the two contact portions 12b protruding toward the side of the vibration member 11. When the vibration wave actuator 10 is driven, the yoke 12a slides while the tip surfaces of the contact portions 12b are in pressure contact with the projections 11c facing the tip surfaces. It is desirable to improve durability of the contact portions 12b by applying surface processing on the contact portions 12b to improve the wear resistance to the projections 11c.

The housing 15 having the fixing portions 15a fixes a part of the flexible printed circuit board lid as described above to support the vibration member 11.

The encoder main body (detection unit) 13 detects the relative position (displacement information) between the vibration member 11 and the contact member 12. The encoder main body (detection unit) 13 may detect the absolute position (position information) between the vibration member 11 and the contact member 12. The "displacement information" refers to information detected by what is called an incremental encoder. The "position information" refers to information detected by what is called an absolute encoder.

In the present exemplary embodiment, a reflective optical sensor having a light emitting element and a light receiving element is used as the encoder main body 13. Light emitted from the encoder main body 13 is reflected by the scale (detected portion) 14 as a reflector. When the encoder main body 13 receives this reflected light, it detects the displacement information (or position information).

The encoder main body 13 and the scale 14 are disposed between the vibration member 11 and the contact member 12 so that the encoder main body 13 faces the pattern of the scale 14 when viewed from the X direction (the direction in which the contact member 12 and the vibration member 11 move relative to each other). The encoder main body 13 is disposed between the two projections 11c in the Z direction (direction in which the vibration member 11 and the contact member 12 contact). The term "between the two projections 11c" does not necessarily need to be "between the two projections 11c", and only need to be on the center side of each of the two projections 11c in the Y direction in the vibration member 11. The scale 14 is disposed between the two contact portions 12b, i.e., on the center side of the two contact portions 12b in the contact member 12 in the Y direction. Therefore, when the vibration wave actuator 10 is viewed from the X direction (the direction in which the contact member 12 and the vibration member 11 move relative to each other), the encoder main body 13 and the scale 14 are disposed in the space surrounded by the vibration member 11 and the contact member 12, as illustrated in FIG. 7.

The encoder main body 13 includes a reflective optical sensor 13a and a sensor flexible printed circuit board 13b which mounts the reflective optical sensor 13a. The encoder main body 13 reads the reflection of light incident onto the scale 14 to detect the displacement information (or position information). The encoder main body 13 is supported by the holding member 16 connected to the fixing portions 15a of the housing 15 and is disposed in parallel with two permanent magnets 17.

The scale 14 is disposed integrally with the contact member 12 at the recessed portion between the two contact portions 12b. Therefore, when the vibration member 11 and the contact member 12 move relative to each other, the scale (detected portion) 14 moves relative to the vibration member 11 together with the contact member 12. In this case, the encoder main body (detection unit) 13 moves relative to the contact member 12 together with the vibration member 11. The scale 14 is provided with a pattern printed along the moving direction of the contact member 12. The pattern made of chromic oxide is formed on the surface of a stainless-steel base material. Although, in the present exemplary embodiment, the scale 14 is bonded to the contact member 12 with an adhesive, it is also possible to directly print the pattern of the scale 14 on the contact member 12 which may also serve as the scale 14. This makes it possible to reduce the number of parts.

The holding member 16 holds the two permanent magnets 17 used as the pressure members 17, and the encoder main body 13. The holding member 16 is fixed to the fixing portions 15a of the housing 15 by using bolts so as to sandwich the backing members provided on the flexible printed circuit board lid of the vibration member 11, and the vibration member 11 is disposed between the holding member 16 and the housing 15. Two portions where the holding member 16 is fixed to the fixing portions 15a form stepped portions convex toward the side of the housing 15. The vibration member 11 is disposed in a space between the two stepped portions. Therefore, the holding member 16 is disposed independently of the vibration member 11 and therefore does not disturb the vibration of the vibration member 11. In addition, the holding member 16 is also disposed independently of the contact member 12. The arrangements of the holding member 16 and the vibration member 11 will be described in detail below.

The pressure members 17 generate a pressure force for bringing the vibration member 11 and the contact member 12 in pressure contact with each other. In the present exemplary embodiment, since the two permanent magnets are used as the pressure members 17, the pressure members 17 are referred to as the permanent magnets 17 in the subsequent descriptions. The lines of magnetic force generated by the two permanent magnets 17 form a magnetic circuit between the elastic member 11a of the vibration member 11 as a ferromagnetic material and the yoke 12a of the contact member 12. An attractive force generated in this case is used to bring the vibration member 11 and the contact member 12 pressure contact with each other.

Figure 3:
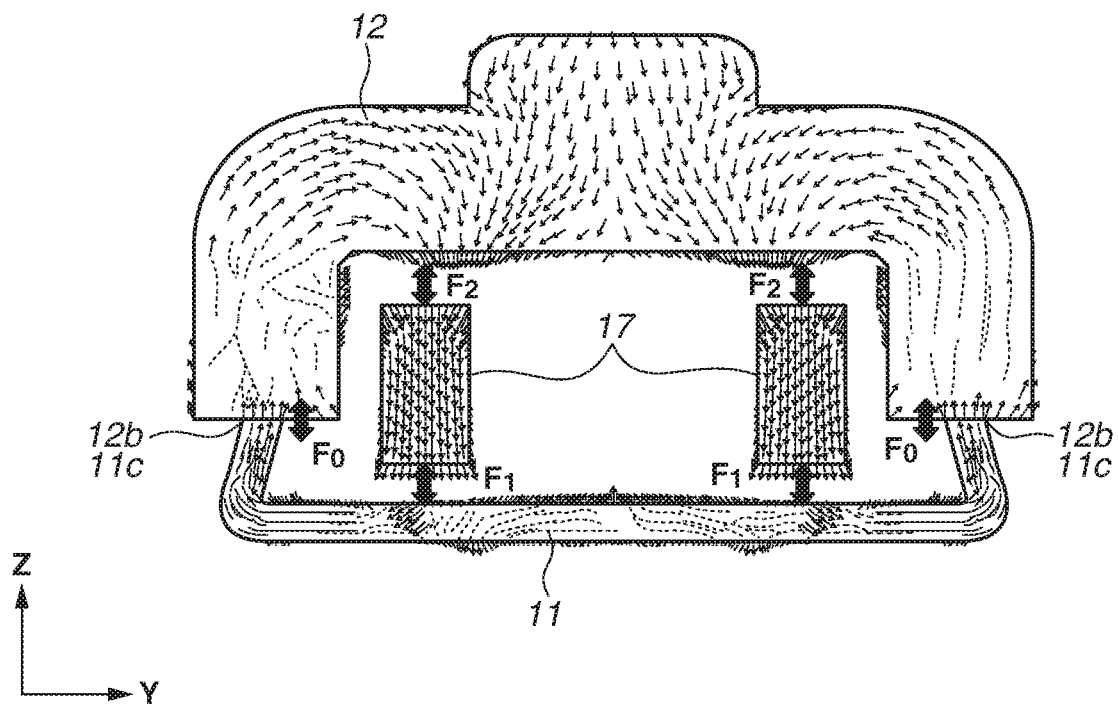
FIG. 3 illustrates a pressurizing method using permanent magnets according to the first exemplary embodiment.

A method for pressurizing the vibration member 11 and the contact member 12 by using the permanent magnets 17 will be described below with reference to FIG. 3. FIG. 3 illustrates a pressurizing method using the permanent magnets 17. Referring to FIG. 3, the lines of magnetic force in magnetic circuit formed within the elastic member 11a and the yoke 12a by the permanent magnets 17 are drawn with thin arrows. More specifically, arrows F0 indicate attractive forces generated between the vibration member 11 and the contact member 12, arrows F1 indicate attractive forces generated between the vibration member 11 and the permanent magnets 17, and arrows F2 indicate attractive forces generated between the contact member 12 and the permanent magnets 17. For simple description, components other than the elastic member 11a, the yoke 12a, and the permanent magnets 17 contributing to the magnetic circuits are not illustrated. As illustrated in FIG. 3, the permanent magnets 17 are disposed in a closed space between the vibration member 11 and the contact member 12 like the encoder main body 13. This makes it possible to maximize the attractive forces generated at the boundaries between the projections 11c of the vibration member 11 and the contact portions 12b of the contact member 12 while minimizing magnetic leakage. The permanent magnets 17 are independently fixed in the space between the vibration member 11 and the contact member 12 not in contact with the vibration member 11 and the contact member 12. Therefore, the attractive forces F1 generated between the vibration member 11 and the permanent magnets 17 and the attractive forces F2 generated between the contact member 12 and the permanent magnets 17 contribute to the pressure force between the vibration member 11 and the contact member 12.

It is desirable to arrange two permanent magnets having the same shape at the same intervals from the centers of the vibration member 11 and the contact member 12 in the Y direction. This configuration allows the generated attractive forces F0, F1, and F2 to balance in the Y direction. As a result, the orientations of the vibration member 11 and the contact member 12 become stable without a moment generated around the X axis passing through the center of gravity of each of the vibration member 11 and the contact member 12. This makes it possible to stabilize the performance of a vibration wave motor when acquiring a pressure force through a magnetic attractive force.

Relationships between the arrangement the vibration member 11, the contact member 12, and the permanent magnets 17 and the generated magnetic attractive forces when viewed from the Y direction will be described below with reference to FIGS. 4A, 4B, and 4C. FIGS. 4A, 4B, and 4C illustrate relationships between the arrangement of the permanent magnets 17 and the magnetic attractive forces. Referring to FIGS. 4A, 4B, and 4C, to simplify the description, the shapes of the vibration member 11, the contact member 12, and the permanent magnets 17 have been changed from the shapes according to the present exemplary embodiment, and the permanent magnets 17 are held by the holding member 16 (not illustrated). Attractive forces F1a and F1b indicate the magnitudes of the attractive forces generated between the vibration member 11 and the permanent magnets 17 on the left and right sides of the Z-Y plane passing through the center of gravity of the vibration member 11, respectively. Attractive forces F2a and F2b indicate the magnitudes of the attractive forces generated between the contact member 12 and the permanent magnets 17 on the left and right sides of the above-described Z-Y plane, respectively.

The positions of the permanent magnets 17 are fixed relative to the vibration member 11 and the contact member 12 and do not move with the relative movement between the vibration member 11 and the contact member 12. Therefore, even when the vibration member 11 and the contact member 12 move relative to each other, the magnitudes of the magnetic attractive forces F1 and F2 are not changed easily, as illustrated in FIG. 4B. In addition, the two permanent magnets 17 are symmetrically disposed with respect to the vibration member 11 centering on the above-described Z-Y plane. Therefore, as illustrated in FIGS. 4A and 4B, when the contact members 12 overlap with the entire surfaces of the permanent magnets 17 on the side of the contact member 12 in the X direction, the magnitudes of the generated magnetic attractive forces become equal on the right and left sides of the Z-Y plane (F1a=F1b, F2a=F2b). More specifically, if the area of the portion where one permanent magnet 17 faces the contact member 12 is equal to the area of the portion where the other permanent magnet 17 faces the contact member 12, the magnitudes of the generated magnetic attractive forces on the left and right sides of the Z-Y plane become equal. In this case, no moment is generated on the vibration member 11 and the contact member 12 around the Y axis passing through the center of gravity of the vibration member 11. Therefore, since the orientations of the vibration member 11 and the contact member 12 become stable, the performance of the vibration wave motor can be further stabilized.

However, when the contact member 12 does not cover the entire surfaces of the permanent magnets 17 on the side of the contact member 12, as illustrated in FIG. 4C, a difference arises between the attractive forces F2a and F2b (F2a<F2b) possibly inclining the orientation of the contact member 12 by the moment generated around the Y axis. Therefore, to maintain the stability of the orientation of the contact ember 12, it is desirable to satisfy a relationship L1−L2≥L3, i.e., L1≥L2+L3, where L1 denotes the length of the contact member 12 in the X direction, L2 denotes the length of the permanent magnets 17, and L3 denotes the maximum moving distance of the contact member 12. When this relationship is satisfied, the moment around the Y axis is not easily generated and the performance of the vibration wave actuator 10 becomes more stable. In this case, the length L1 of the contact member 12 is longer than the maximum moving distance L3 of the contact member 12. The length L1 of the contact member 12 and the length L2 of the permanent magnets 17 are set in the specifications of the vibration wave actuator 10. The maximum moving distance L3 of the contact member 12 can be set through drive control for the vibration wave actuator 10 or a mechanical configuration such as a positioning pin to which the contact member 12 abuts.

When permanent magnets are used as pressure members in this way, it is desirable to symmetrically arrange permanent magnets with reference to the center of the vibration member 11 in each of the X and Y directions. The number of permanent magnets to be used is not limited to two as in the present exemplary embodiment and may be one or three or more. In the present exemplary embodiment, additional two permanent magnets 17 are symmetrically disposed centering on the Z-X plane passing through the center of the vibration member 11 in the Y direction. In addition, the encoder main body 13 is disposed between the two permanent magnets 17 disposed in parallel in the Y direction. In this configuration, the permanent magnets 17 and the encoder main body 13 are disposed in parallel in the Y direction, making it possible to reduce the size of the vibration wave actuator 10 in the Z direction.

The configuration of a pressurizing unit is not limited to the above-described configuration. For example, the contact portions 12b of the contact member 12 and the projections 11c of the vibration member 11 may be in pressure contact with each other through a, pressurizing unit such as a pressurizing spring.

The two projections 11c are located in an approximately rotationally symmetrical manner to the axis of the pressure force direction passing through the center of gravity of the vibration member 11. In addition, it is desirable so as to dispose the two fixing portions 15a provided on the flexible printed circuit board 11d in an approximately rotationally symmetrical manner to the axis of the Z direction passing through the center of gravity of the vibration member 11 as with the two projections 11c. In this case, the pressure force generated by the above-described unit and the reaction force are equally distributed to the two projections 11c of the vibration member 11 and the two fixing portions 15a of the flexible printed circuit board 11d. As a result, the vibration member 11 is supported on the center of gravity at the orientation thereof becomes more stable.

The vibration member 11 according to the present exemplary embodiment can be excited in two different bending vibration modes. Combining the two bending vibration modes enables producing an elliptical movement which draws an elliptically moving locus in the same direction on the contact surfaces.

The shape of the vibration member 11 is determined so that (when the higher resonance frequency of the resonance frequencies of the two bending vibration modes is fa) the resonance frequencies of the two bending vibration modes are brought close to achieve a desired difference Δf between the resonance frequencies of the two bending vibration modes. More specifically, the difference between the resonance frequencies of the two bending vibration modes can be brought close to the desired difference Δf by suitably setting the longitudinal size (long side), the size in the direction perpendicularly intersecting with the longitudinal direction (short side), and the size in the direction perpendicularly intersecting with the long and short sides (plate thickness) of the shape of the vibration member 11.

FIGS. 5A and 5B are perspective views illustrating the two different bending vibration modes according to the present exemplary embodiment. FIG. 5A is a perspective view illustrating a vibration state in the first bending vibration mode out of the two bending vibration modes, where lines Y1 and Y2 indicate nodal lines in this mode. FIG. 5B is a perspective view illustrating a vibration state in the second bending vibration mode out of the two bending vibration modes, where lines X1, X2, and Y3 indicate nodal lines in this mode. When the vibration member 11 is excited in the first bending vibration mode, a reciprocating motion having an amplitude in the Z direction indicated by arrows illustrated in FIG. 5A can be produced mainly on the contact surfaces at the tips of the two projections 11c. When the vibration member 11 is excited in the second bending vibration mode, a reciprocating motion having an amplitude in the X direction indicated by arrows illustrated in FIG. 5B can be produced mainly on the contact surfaces at the tips of the two projections 11c. The two bending vibration modes indicate vibrations in the out-of-plane direction (Z direction) with respect to the X-Y plane of the vibration member 11. Therefore, a nodal line or node according to the present exemplary embodiment means a position on the vibration member 11 where the vibration amplitude in the Z direction is hardly produced (or minimized).

Figure 6:
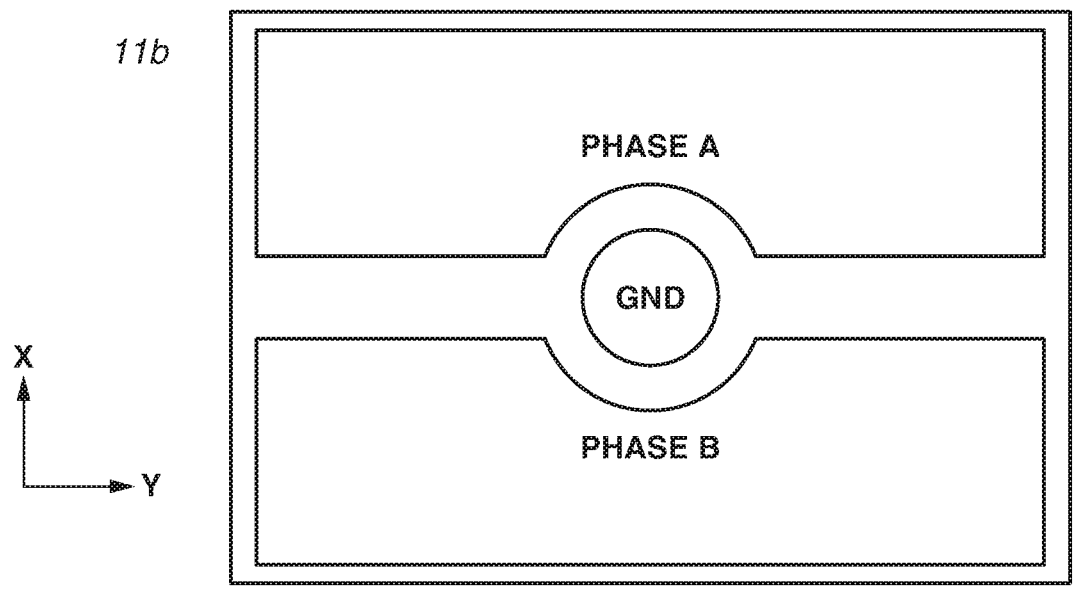
FIG. 6 illustrates an electrode pattern of a piezoelectric element included in the vibration member illustrated in FIGS. 1A and 1B.

FIG. 6 illustrates an electrode pattern on the back surface of the piezoelectric element 11b. There are provided a phase-A electrode member and a phase-B electrode member divided by a nodal line Y3 approximately in parallel in the Y direction in the second bending vibration mode illustrated in FIG. 5B. There is also provided, at the center of the piezoelectric element 11b, a ground electrode member (GND) taken out from the ground electrode on the bonding surface to the elastic member 11a via a through hole. The phase-A electrode member and the phase-B electrode member illustrated in FIG. 6 have undergone a poling procedure in the same direction in the Z direction. The vibration member 11 can be excited for the above-described vibration by applying a plurality of alternating-current (AC) signals as drive signals to these electrodes by using a known drive method.

Figure 12:
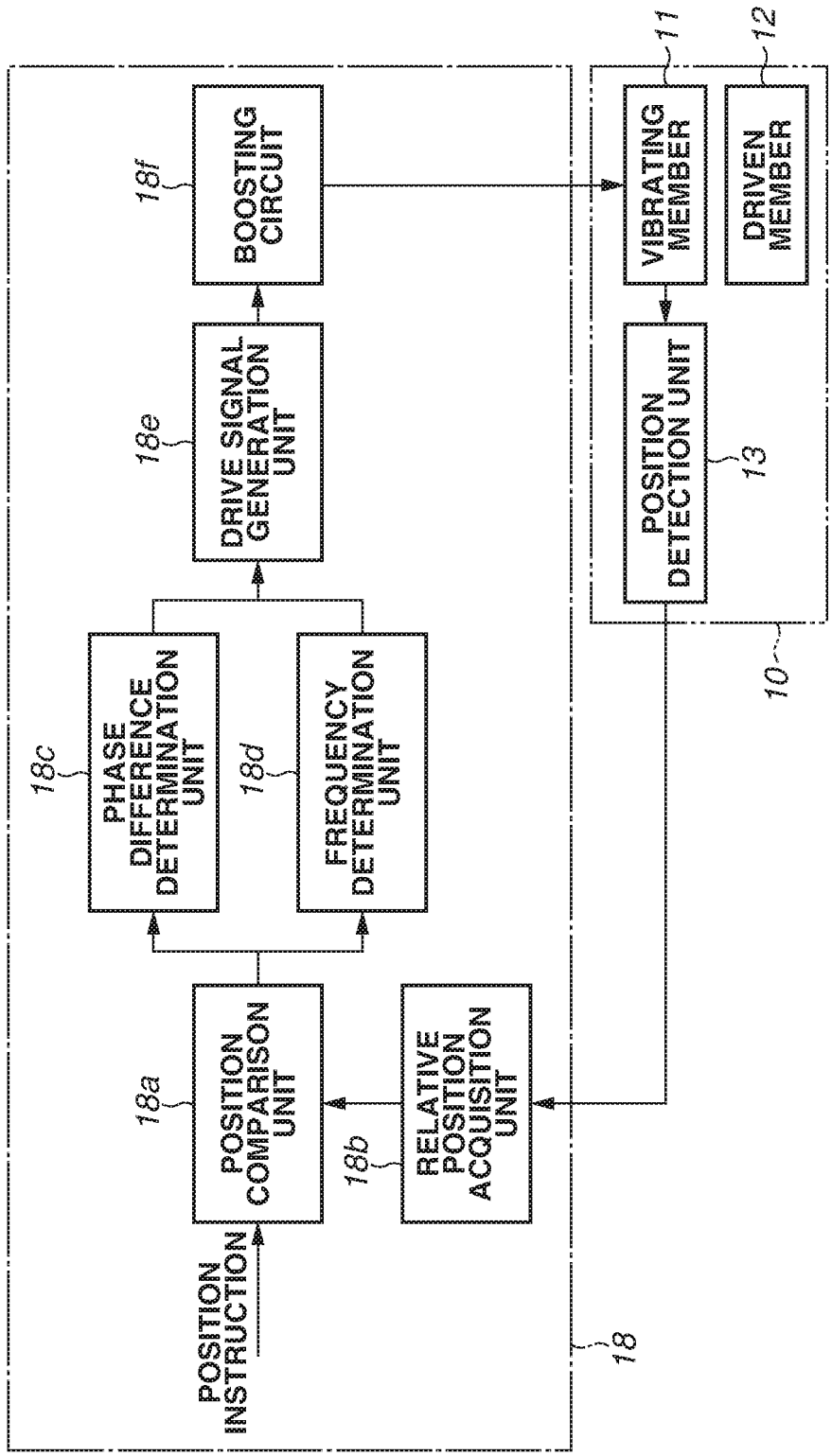
FIG. 12 is a block diagram illustrating control of the vibration wave actuator according to the first exemplary embodiment.

An example of a method for controlling the vibration wave actuator 10 will be described below with reference to FIG. 12. FIG. 12 is a block diagram illustrating an example of a method for controlling the vibration wave actuator 10.

The vibration wave actuator 10 is connected with the control apparatus 18. The control apparatus 18 includes a position comparison unit 18a, a relative position acquisition unit 18b, a phase difference determination unit 18c, a frequency determination unit 18d, a drive signal generation unit 18e, and a boosting circuit 18f. The relative position acquisition unit 18b acquires a relative position between the vibration member 11 and the contact member 12 by using the detection result (displacement information (or position information)) of the encoder main body 13. The relative position acquired by the relative position acquisition unit 18b is input to the position comparison unit 18a which then compares the relative position with a position instruction. Based on the comparison result by the position comparison unit 18a, the phase difference determination unit 18c and the frequency determination unit 18d determine the phase difference and frequencies of the two AC signals as drive signals, and the drive signal generation unit 18e generates a drive signal based on the phase difference and frequencies. The generated drive signal is boosted by the boosting circuit 18f and applied to the electro-mechanical energy transducer 11b of the vibration member 11, and then the vibration wave actuator 10 is driven. The above-described control method is to be considered as an example. The drive speed of the vibration wave actuator 10 may be controlled by changing the voltage amplitude of the drive signal.

The arrangements of the encoder main body 13 and the scale 14 as the detection unit built in the vibration wave actuator 10 will be described below with reference to FIG. 7. FIG. 7 is a plan view illustrating an arrangement of the detection unit, i.e., the vibration wave actuator 10 when viewed from the moving direction of the contact member 12.

On the holding member 16 connected to the fixing portions 15a of the housing 15, the encoder main body 13 is disposed at a position facing the pattern 14a of the scale 14, in parallel with the two permanent magnets 17. The holding member 16 is disposed in the housing 15 via the fixing portions 15a which are substantially vibration-insulated from the vibration member 11 and the contact member 12. This allows the holding member 16 to be held between the vibration member 11 and the contact member 12 without disturbing the driving of the vibration wave actuator 10.

Figure 13:
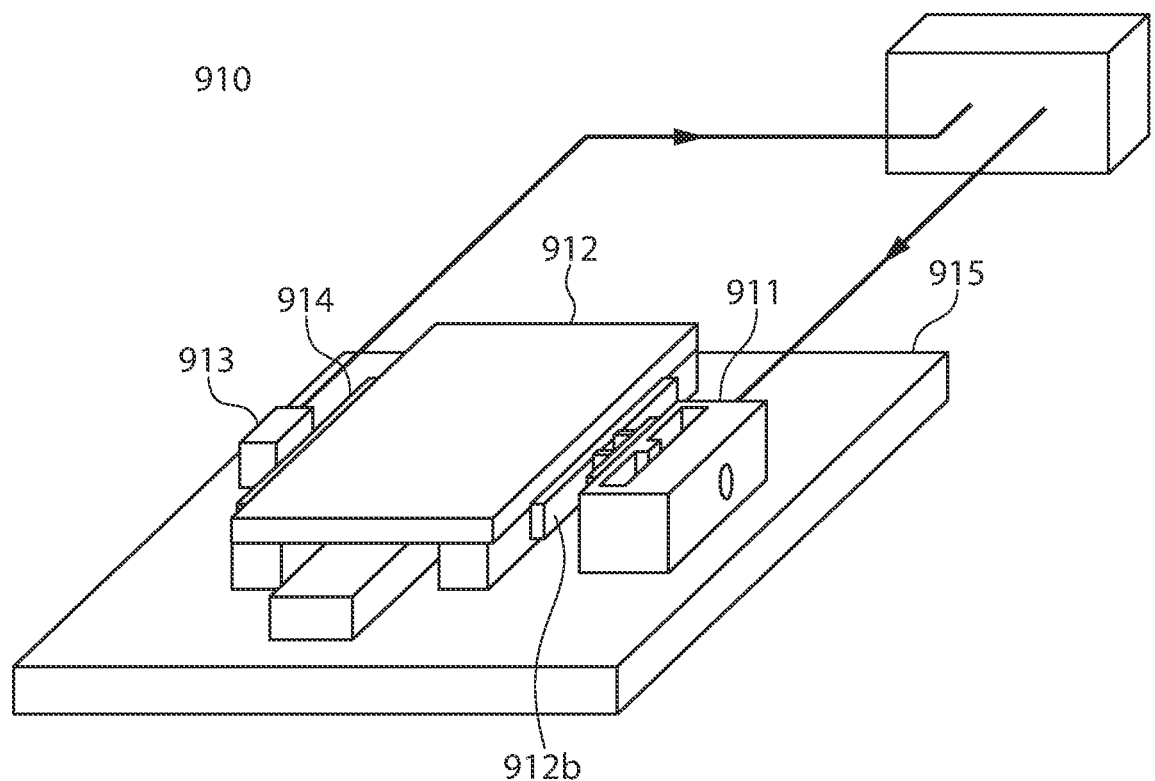
FIG. 13 illustrates a configuration of a vibration wave actuator based on a conventional technique discussed in Japanese Patent Application Laid-Open No. 2009-27865.
Figure 14:
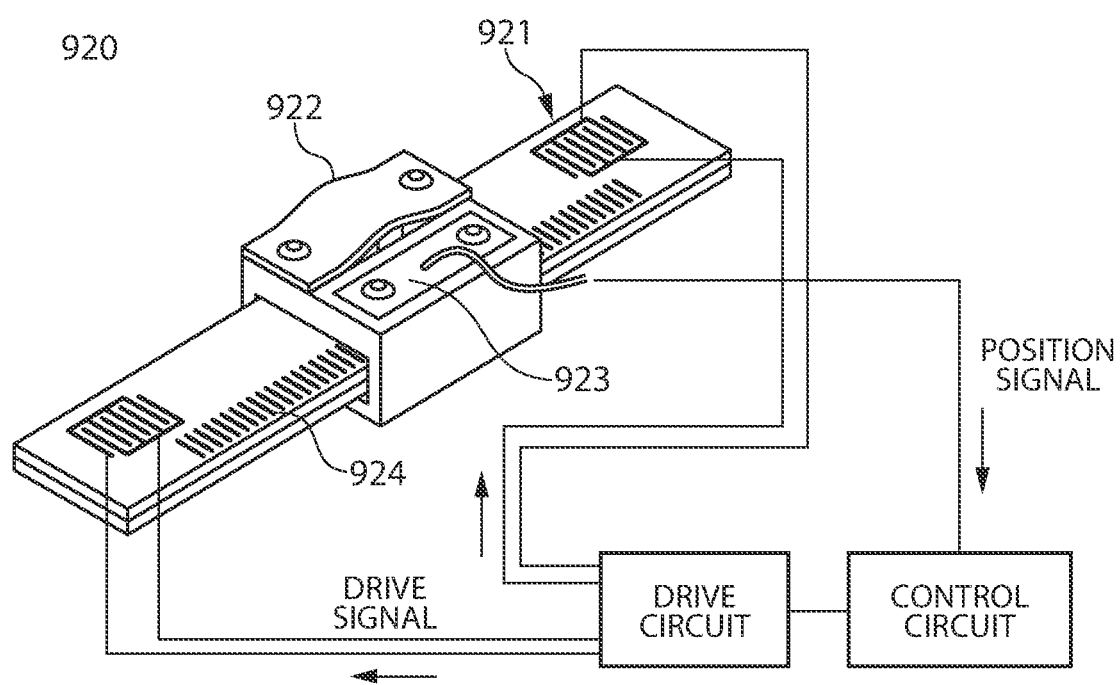
FIG. 14 illustrates a configuration of a vibration wave actuator based on a conventional technique discussed in Japanese Patent Application Laid-Open No. 2001-69772.

Then, the vibration wave actuator 10 according to the present exemplary embodiment is compared with the vibration wave actuator 910 based on a conventional technique illustrated in FIG. 13. In the vibration wave actuator 910, the encoder main body 913 and the scale 914 are disposed outside the space surrounded by the vibration member 911 and the contact member 912, and the overall size of the vibration wave actuator 910 is increased. In addition, in the vibration wave actuator 910, when the encoder main body 913 is disposed between the two projections of the vibration member 911 as in the present exemplary embodiment, it is necessary to provide the scale 914 corresponding to the encoder main body 913 at a position on the contact member 912 facing the encoder main body 913. However, when an encoder is disposed between the two projections of the vibration member 911, the encoder faces the contact unit 912b of the contact member 912, and it becomes impossible to provide the scale 914 on the side of the contact member 912.

On the other hand, according to the present exemplary embodiment, the contact member 12 has the two contact portions 12b convex toward the side of the vibration member 11 and disposed in parallel in the Y direction. Since the scale 14 to be used for the detection unit can be disposed between the two contact portions 12b, the scale 14 can be provided inside the space across which the vibration member 11 and the contact member 12 face each other. A plurality of projections 11c having contact surfaces needs to be provided on the side of the vibration member 11 corresponding to the arrangement of the contact portions 12b. Since the two projections 11c provided on the vibration member 11 are symmetrically located centering on the center of the vibration member 11 at certain intervals in the Y direction, it is possible to allocate a space for disposing the encoder main body 13 while stabilizing the orientation of the vibration member 11 at the time of pressurization.

In the vibration wave actuator 10 according to the present exemplary embodiment, the encoder main body 13 and the scale 14 used for the detection unit are disposed between the two contact portions 12b or between the two projections 11c and in the space across which the vibration member 11 and the contact member 12 face each other. Therefore, the vibration wave actuator 10 makes it possible to restrict the increase in apparatus size due to the provision of the encoder main body 13 and the scale 14 as the detection unit. In addition, the encoder main body 13 and the scale 14 are disposed in a state of being vibration-insulated from the vibration member 11, it is possible to prevent the degradation in drive performance. As a result, according to the present exemplary embodiment, providing a detection unit enables further reducing the size of the vibration wave actuator 10 than the conventional technique while reducing such influences as the degradation in drive performance.

The detection unit is not limited to the above-described reflective optical sensor and may be other sensors. For example, in a case where an elastic force by a pressurizing spring is used instead of a magnetic circuit, a Hall element or a magnetic sensor such as a magnetoresistive element may be employed as an encoder, and a magnetic force generation unit, more specifically, a patterned magnet may be usable as a scale.

Figure 8A:
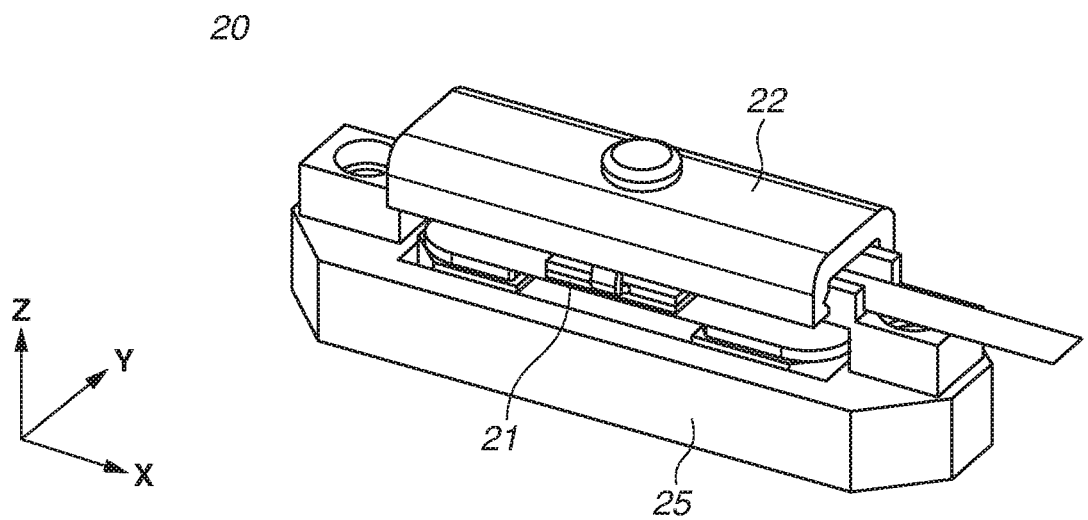
FIGS. 8A and 8B are perspective views schematically illustrating a configuration of a vibration wave actuator according to a second exemplary embodiment.
Figure 8B:
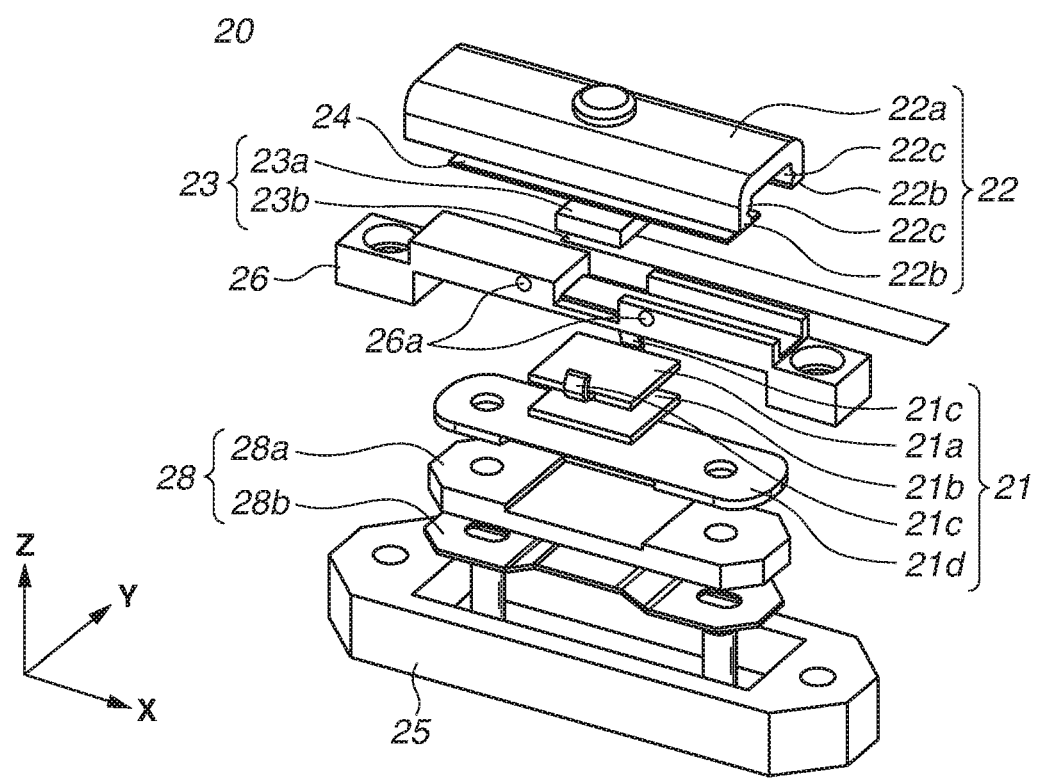

A vibration wave actuator 20 according to a second exemplary embodiment will be described below with reference to FIGS. 8A and 8B. FIG. 8A is a perspective view illustrating a configuration of the vibration wave actuator 20, FIG. 8B is an exploded perspective view illustrating components of the vibration wave actuator 20. The present exemplary embodiment differs from the first exemplary embodiment in that a Hall element is used as an encoder main body (detection unit), a magnet-based scale is used, and a pressure force of a plate spring is used to bring a vibration member and a contact member into pressure contact with each other. Although, in the present exemplary embodiment, the encoder main body (detection unit) detects a relative position (displacement information) between the vibration member and the contact member, the encoder may detect an absolute position (position information) as in the first exemplary embodiment.

The vibration wave actuator 20 includes a vibration member 21, a contact member 22, a Hall element 23 as a detection unit (encoder main body), a scale 24, a housing 25, a holding member 26, and a pressure member 28.

The housing 25 is provided with a recessed portion and the pressure member 28 disposed in the recessed portion. The pressure member 28 has a base 28a and a plate spring 28b disposed on the base 28a. An elastic force by the plate spring 28b is applied from the vibration member 21 toward the contact member 22 via the base 28a. The contact member 22 has a non-contact portion 22a not in contact with the vibration member 21, contact portions 22b in contact with the vibration member 21, and groove portions 22c. The contact portions 22b are protruded from the non-contact portion 22a toward the side of the vibration member 21. The groove portions 22c are V-grooves formed as a part of the contact portions 22b.

The holding member 26 holds the Hall element 23 as a detection unit. The holding member 26 is provided with four steel balls 26a which are engaged with the groove portions 22c, as illustrated in FIG. 9. FIG. 9 is a plan view illustrating the contact member 22 when viewed from the moving direction. The elastic force of the pressure member 28 is applied from the vibration member 21 toward the contact member 22 via the base 28a and is received by the four steel balls 26a. Similar to the first exemplary embodiment, the holding member 26 is independently provided in a state of being vibration-insulated from the vibration member 21 and therefore is not easily affected by the vibration of the vibration member 21. In addition, the holding member 26 is configured not to disturb the driving of the contact member 22.

The Hall element 23 is a detection unit (encoder main body) for detecting relative movement information (or position information) and is also a magnetic sensor for converting the magnetic field generated by a magnet or current into an electrical signal by using the Hall effect. The Hall element 23 is disposed on the side of the contact member 22 compared with the holding member 26 and is disposed between the vibration member 21 and the contact member 22 and between the two projections 21c. The term "between the two projections 21c" includes the center line side of each of the two projections 21c in the vibration member 21 in the Y direction.

The scale 24 is disposed, between two projections 21c, on the surface of the non-contact portion 22a on the side of the vibration member 21 to face the flail element 23. The scale 24 is provided with the pattern 24 formed through multipolar magnetization. Although, in the present exemplary embodiment, the scale 23 and the contact member 22 are separate parts, the non-contact portion 22a of the contact member 22 may have the function of the scale 24. In other words, the contact member 12 and scale 24 may be integrated in one part so that the contact member 12 can also work as the scale 24. In this case, the contact portions 22b of the contact member 22 are applied with wear-resistant plating treatment and the vibration member 21 is made of a non-magnetic material. This configuration is desirable since an unnecessary magnetic circuit is not formed while durability as a motor is ensured, and thus the drive performance of the vibration wave actuator 20 is not disturbed. Since this configuration enables reducing the number of parts, it is expected to further reduce the size of the vibration wave actuator 20.

According to the present exemplary embodiment, the Hall element 23 is used as a detection unit. Therefore, since the detection unit as a single unit can be further reduced in size than a reflective optical sensor including a light emitting element, the area for installing the detection unit can be reduced. In addition, since no permanent magnet is used as a pressure unit, it is not necessary to secure a space for arranging a magnet between the vibration member 21 and the contact member 22.

In the vibration wave actuator 10 according to the first exemplary embodiment, parallelly arranging in the Y direction the permanent magnets 17 for generating a pressure force advantageously enables size reduction in the X direction. In the vibration wave actuator 20 according to the second exemplary embodiment, parallelly arranging in the X direction the fixing portions of the holding member 16 that receives a pressure force advantageously enables size reduction in the Y direction.

It is desirable to suitably select any one of these configurations according to the direction in which the vibration wave actuator 20 is to be reduced in size.

In the vibration wave actuator 10 according to the first exemplary embodiment, the vibration member 11 and the contact member 12 also functions as a magnetic shield. This can eliminate the necessity of the magnetic shield. This enables the vibration wave actuator 10 to exert the magnetic pressurization without a size increase.

In the magnetic type encoder according to the second exemplary embodiment, even if powder dusts enter between the Hall element 23 and the scale 24, almost no trouble has occurred for detection function (displacement information and position information). This eliminates the necessity of the separate dustproof cover and the size of vibration wave actuator 10 can be reduced.

A third exemplary embodiment will be described below centering on a configuration of an imaging apparatus 700 with reference to FIGS. 10A and 10B. The imaging apparatus 700 is an example of an apparatus having the vibration wave actuator according to each of the above-described exemplary embodiments.

Figure 10A:
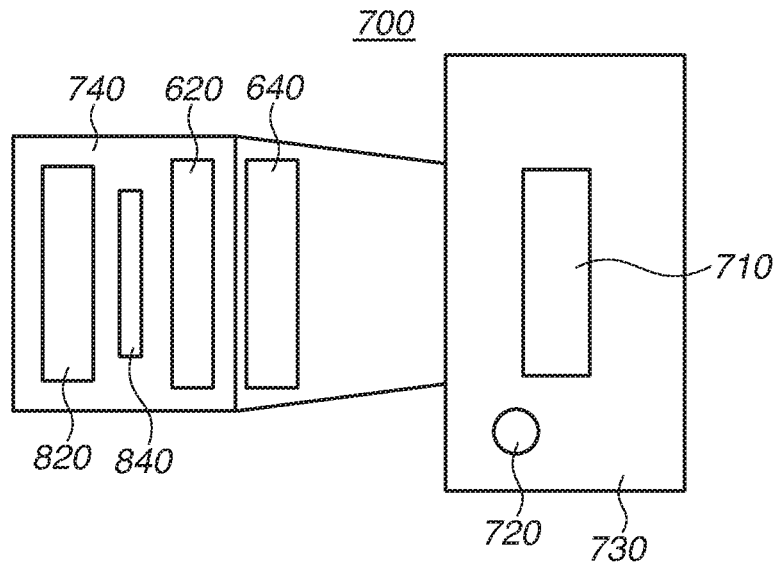
FIGS. 10A and 10B are respectively a top view and a block diagram schematically illustrating a configuration of an imaging apparatus according to a third exemplary embodiment.

FIG. 10A is a top view schematically illustrating the configuration of the imaging apparatus 700. The imaging apparatus 700 has a camera main body 730 mounting an image sensor 710 and a power button 720. The imaging apparatus 700 also has a lens barrel 740 including a first lens group 810 (not illustrated in FIG. 10A), a second lens group 820, a third lens group 830 (not illustrated in FIG. 10A), a fourth lens group 840, which configure an optical system, and vibration wave actuator units 620 and 640. The lens barrel 740 is an interchangeable lens, and as the lens barrel 740, a lens barrel suitable for an imaging target can be attached to the camera main body 730. In the imaging apparatus 700, the two vibration wave actuator units 620 and 640 drive the second lens group 820 and the fourth lens group 840 included in the optical system, respectively.

Figure 10B:
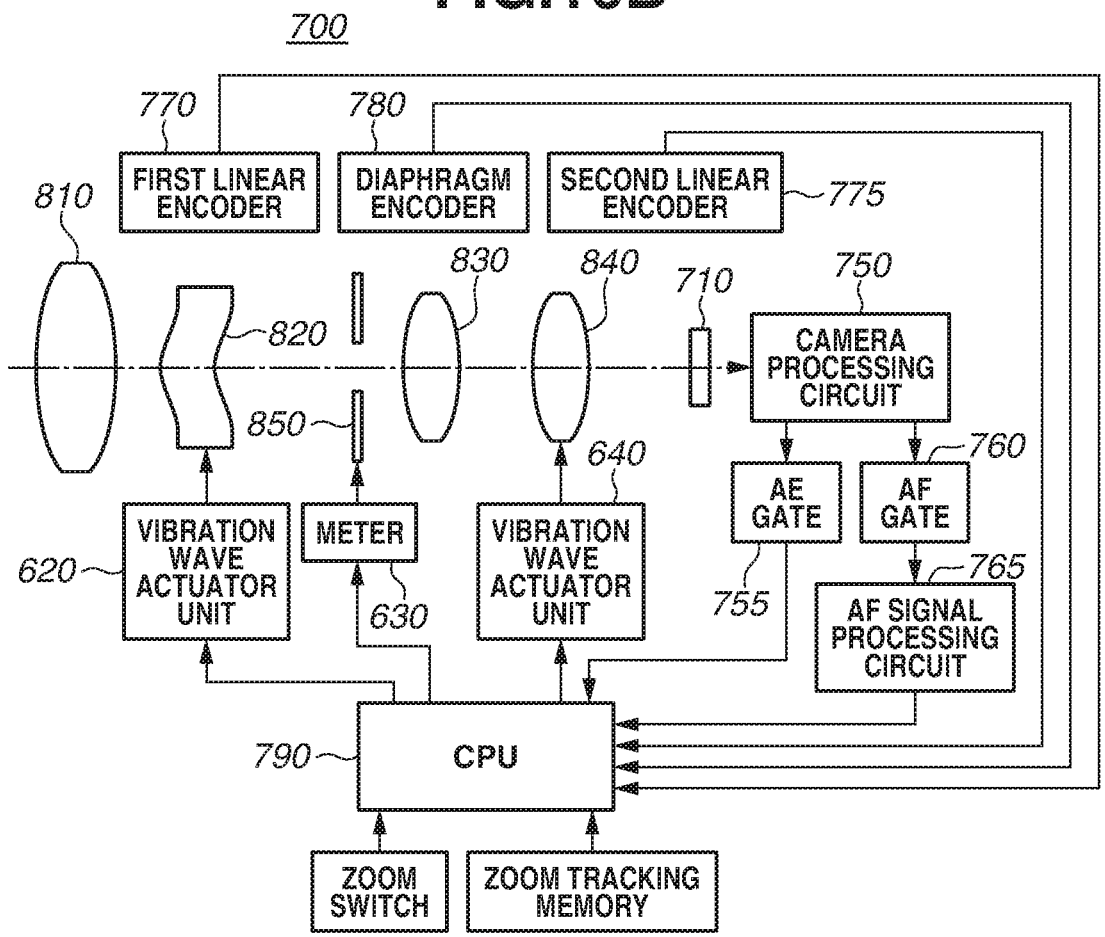

FIG. 10B is a block diagram illustrating an overall configuration of the imaging apparatus 700. The first lens group 810, the second lens group 820, the third lens group 830, the fourth lens group 840, and a light quantity adjustment unit 850 are disposed at predetermined positions on the optical axis inside the lens barrel 740. Light passes the first lens group 810, the second lens group 820, the third lens group 830, the fourth lens group 840, and the light quantity adjustment unit 850, and is focused on the image sensor 710. The image sensor 710 converts an optical image formed by the optical system into an electrical signal and outputs the signal to a camera processing circuit 750.

The camera processing circuit 750 performs amplification, gamma correction, etc. on the output signal from the image sensor 710. The camera processing circuit 750 is connected to a central processing unit (CPU) 790 via an automatic exposure (AE) gate 755 and is also connected to the CPU 790 via an automatic focus (AF) gate 760 and an AF signal processing circuit 765. A video signal having undergone predetermined processing by the camera processing circuit 750 is sent to the CPU 790 via the AE gate 755, the AF gate 760, and the AF signal processing circuit 765. The AF signal processing circuit 765 extracts high-frequency components of the video signal, generates an evaluation value signal for AF, and supplies the generated evaluation value to the CPU 790.

The CPU 790 is a control circuit for controlling overall operations of the imaging apparatus 700 and generates control signals for exposure determination and focusing based on the acquired video signal. To acquire the determined exposure and a suitable focal state, the CPU 790 controls the drive of the vibration wave actuator units 620 and 640 and a meter 630 to adjust the positions of the second lens group 820, the fourth lens group 840, and the light quantity adjustment unit 850 in the optical axis direction. Under control of the CPU 790, the vibration wave actuator unit 620 moves the second lens group 820 in the optical axis direction, the vibration wave actuator unit 640 moves the fourth lens group 840 in the optical axis direction, and the light quantity adjustment unit 350 is controlled and driven by the meter 630.

The position of the second lens group 320 driven by the vibration wave actuator unit 620 in the optical axis direction is detected by the first linear encoder 770, and the detection result is sent to the CPU 790. Thus, the position of the second lens group 320 is fed back to the driving of the vibration wave actuator unit 620. Similarly, the position of the fourth lens group 840 driven by the vibration wave actuator unit 640 in the optical axis direction is detected by the second linear encoder 775, and the detection result is sent to the CPU 790. Thus, the position of the fourth lens group 840 is fed back to the driving of the vibration wave actuator unit 640. The position of the light quantity adjustment unit 350 in the optical axis direction is detected by the iris diaphragm encoder 780, and the detection result is notified to the CPU 790. Thus, the position of the light quantity adjustment unit 350 is fed back to the driving of the meter 630.

According to the present exemplary embodiment, the lens groups 810 to 840 are moved by using the vibration wave actuator 10 according to the first exemplary embodiment as a driving apparatus of the vibration wave actuator units 620 and 640. Therefore, the first linear encoder 770 is built in and integrally configured with the vibration wave actuator unit 620. The second linear encoder 775 is built in and integrally configured with the vibration wave actuator unit 640.

According to the imaging apparatus 700 of the present exemplary embodiment, the vibration wave actuator 10 can be further reduced in size than a conventional one, making it possible to further reduce the space for disposing the vibration wave actuator 10 in the vibration wave actuator units 620 and 640 than a conventional one. As a result, the vibration wave actuator units 620 and 640 can be further reduced in size than conventional ones. Since the space for disposing the vibration wave actuator 10 in the imaging apparatus 700 is reduced, additional components can be added.

In a case where the vibration wave actuator 10 according to the first exemplary embodiment is used for moving a predetermined lens group of the imaging apparatus 700 in the optical axis direction, a large holding force is maintained also in a state where the lens group is stopped. This enables reducing the possibility of a movement of the lens group even if an external force acts on the lens barrel 740 or the imaging apparatus main body.

In a case where a camera shake correction lens is built in (included) the lens barrel 740 or the optical system of the imaging apparatus, the vibration wave actuator 10 according to the above-described exemplary embodiment is applicable as a driving unit for a camera shake correction unit for moving the camera shake correction lens ins directions orthogonal to the optical axis of the optical system. In this case, to allow a lens holding member to move in two directions perpendicularly intersecting with each other in a plane perpendicularly intersecting with the optical axis direction, one or a plurality of vibration wave actuator units 10 for driving the lens holding member for each direction is disposed. Instead of driving the camera shake correction lens, the camera shake correction unit may move the image sensor 710 (built in the imaging apparatus main body) in directions orthogonal to the optical axis of the optical system.

Figure 11:
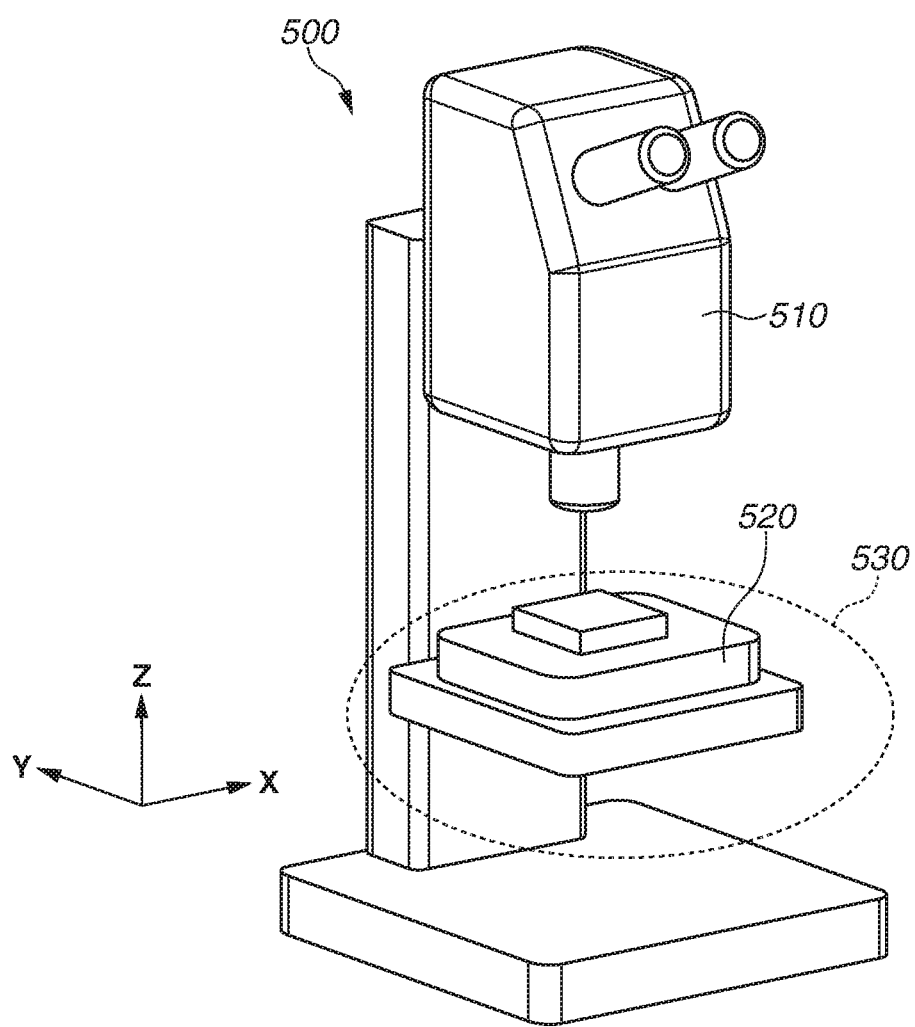
FIG. 11 is a perspective view illustrating a microscope according to a fourth exemplary embodiment.

A fourth exemplary embodiment will be described below centering on a configuration of a microscope 500 having an X-Y stage with reference to FIG. 11. The microscope 500 is an example of an apparatus having at least two vibration wave actuator units according to each of the above-described exemplary embodiments. FIG. 11 is a perspective view illustrating an appearance of the microscope 500.

The microscope 500 includes an imaging unit 510 including an image sensor and an optical system, and an automatic stage 530. The automatic stage 530 has a base, a first vibration wave actuator (not illustrated) and a second vibration wave actuator (not illustrated) disposed on the base, and a stage 520 moved within the X-Y plane disposed on the base. Each of the first and the second vibration wave actuators uses the vibration wave actuator 10 according to the first exemplary embodiment.

The first vibration wave actuator is used as a driving unit for driving the stage 520 in the X direction of the stage 520. The first vibration wave actuator is disposed so that the direction of the relative movement between the vibration member 11 and a part of the contact member 12 (the moving direction of the vibration member 11 relative to the contact member 12, i.e., the moving direction of the contact member coincides with the X direction of the stage 520. The second vibration wave actuator is used as a driving unit for driving the stage 520 in the Y direction of the stage 520. The second vibration wave actuator is disposed so that the direction of the relative movement between the vibration member 11 and a part of the contact member 12 relative to the contact member 12, i.e., the moving direction of the contact member 12) coincides with the Y direction of the stage 520.

An object to be observed is placed on the upper surface of the stage 520, and an enlarged image is captured by the imaging unit 510. When there is a wide observation range, an imaging area is changed by driving the automatic stage 530 by using the first and the second vibration wave actuators to move the stage 520 in the in-plane direction to move the object under observation. When images captured in different imaging areas are combined through image processing by using a computer (not illustrated), one high-definition image can be acquired in a wide observation range.

While the present invention has specifically been described based on the exemplary embodiments, the present invention is not limited thereto, and can be modified in diverse ways without departing from the spirit and scope the present invention. In addition, the above-described exemplary embodiments are to be considered as illustrative and not restrictive of the scope of the present invention. These exemplary embodiments can also be suitably combined.

For example, in the third and the fourth exemplary embodiments, the vibration wave actuator 10 according to the first exemplary embodiment is used as a vibration wave actuator. However, a vibration wave actuator is not limited thereto and may be the vibration wave actuator 20 according to the second exemplary embodiment. The configuration of the pressure member and the pressurizing method can be suitably changed.

Although, in the above-described exemplary embodiments, the vibration member and the contact member linearly move relative to each other (linear drive), the drive method is not limited thereto. The contact member may be driven to rotate relative to the vibration member by using the vibration wave actuator according to each exemplary embodiment. In this case, arbitrary positions of the vibration member 11 and the contact member 12 move relative to each other by an elliptical movement generated at the projections 11c. The direction of the relative movement is referred to as the moving direction of the vibration member 11 relative to the contact member 12 (i.e., the moving direction of the contact member 12).

Although, in the above-described exemplary embodiments, two projection of the vibration member and two contact portions of the contact member are provided, the number of projections and the number of contact portions are not limited thereto, and more projections and contact portions may be provided. For example, two pairs of two projections located in the Y direction may be disposed in the X direction, and contact portions may be disposed on the contact member at positions facing the four projections.

According to a vibration wave actuator as an aspect of the present invention, it is possible to provide a vibration wave actuator which can be further reduced in size than a conventional one while reducing adverse effects on the driving performance due to the provision of a detection unit (encoder).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-192058, filed Sep. 29, 2017, which is hereby incorporated by reference herein in its entirety.

What is claimed is:

1. A vibration wave actuator having a vibration member including an elastic member and an electro-mechanical energy transducer, and a contact member in contact with the vibration member, the contact member and the vibration member moving relative to each other in a relative movement direction, the vibration wave actuator comprising:
   a detected portion configured to move, together with the contact member, relative to the vibration member; and
   a detection unit configured to move, together with the vibration member, relative to the contact member to detect displacement information or position information for the detected portion,
   wherein the vibration member has two projections provided side by side in a direction intersecting with the relative movement direction,
   wherein the contact member contacts the two projections, and
   wherein the detection unit and the detected portion are located between the two projections in the direction intersecting with the relative movement direction.

2. The vibration wave actuator according to claim 1, further comprising a holding member configured to hold the detection unit, and a base member,
   wherein the holding member is fixed to the base member and is not held by the vibration member and the contact member.

3. The vibration wave actuator according to claim 1, wherein the detection unit is a reflective optical sensor.

4. The vibration wave actuator according to claim 3, wherein the detected portion is a reflector for reflecting light from the optical sensor.

5. The vibration wave actuator according to claim 1, wherein the detection unit is a Hall element or a magnetoresistive element.

6. The vibration wave actuator according to claim 5, wherein the detected portion is a magnetic force generation unit.

7. The vibration wave actuator according to claim 1, further comprising a spring member,
wherein the vibration member and the contact member are brought into pressure contact with each other by an elastic force of the spring member.

8. The vibration wave actuator according to claim 1, further comprising a permanent magnet disposed between the vibration member and the contact member,
wherein each of the vibration member and the contact member has a ferromagnetic material, and
wherein the vibration member and the contact member are brought into pressure contact with each other by an attractive force generated by a magnetic circuit formed by the permanent magnet, the vibration member, and the contact member.

9. The vibration wave actuator according to claim 8, further comprising a holding member configured to hold the permanent magnet, and a base member,
wherein the holding member is fixed to the base member and is not held by the vibration member and the contact member.

10. The vibration wave actuator according to claim 9, wherein the holding member holds the detection unit.

11. The vibration wave actuator according to claim 8, further comprising another permanent magnet,
wherein the detection unit is disposed between the two permanent magnets.

12. The vibration wave actuator according to claim 11, wherein, in a relative movement direction, the two permanent magnets are symmetrically disposed centering on a plane passing through the center of gravity of the vibration member and orthogonal to the relative movement direction.

13. The vibration wave actuator according to claim 9, wherein a relation $L1 \geq L2+L3$ is satisfied,
where L1 denotes a length of the contact member in the relative movement direction, L2 denotes a length of the permanent magnet in the relative movement direction, and L3 denotes a maximum moving distance of the contact member.

14. The vibration wave actuator according to claim 1, wherein an excited vibration of the vibration member is formed of two different bending vibration modes.

15. The vibration wave actuator according to claim 1, wherein the detection unit and the detected portion are located between the contact member and the vibration member.

16. The vibration wave actuator according to claim 1,
wherein the contact member and the detected portion are not integrated in one part.

17. A lens barrel comprising:
an optical system; and
the vibration wave actuator according to claim 1 configured to move the lens included in the optical system in an optical axis direction or a direction orthogonal to the optical axis direction.

18. An imaging apparatus comprising:
an optical system;
the vibration wave actuator according to claim 1 configured to move, in the optical axis direction or the direction orthogonal to the optical axis direction, the lens included in the optical system; and
an image sensor configured to convert an optical image formed by the optical system into an electric signal.

19. An imaging apparatus comprising:
an optical system;
an image sensor configured to convert an optical image formed by the optical system into an electric signal; and
the vibration wave actuator according to claim 1 configured to move the image sensor in a direction orthogonal to an optical axis direction of the optical system.

20. A stage apparatus comprising:
a stage; and
the vibration wave actuator according to claim 1 configured to move the stage in a plane of the stage.

* * * * *